Sept. 22, 1953 C. E. McCLELLAN 2,653,243

AUTOMATIC TUNING OF RESONANT CIRCUITS

Filed Aug. 17, 1948

WITNESSES:
E. A. McCloskey
Leon M. Garman

INVENTOR
Cyril E. McClellan.
BY
Hyman Diamond
ATTORNEY

Patented Sept. 22, 1953 2,653,243

UNITED STATES PATENT OFFICE 2,653,243

AUTOMATIC TUNING OF RESONANT CIRCUITS

Cyril E. McClellan, Glen Burnie, Md., assignor to Westinghouse Electric Corporation, East Pittsburgh, Pa., a corporation of Pennsylvania Application August 17, 1948, Serial No. 44,633

9 Claims. (Cl. 250—36)

This invention relates generally to systems for tuning resonant circuits and more particularly to systems for tuning resonant circuits to the mean frequency established by a source of signals having a frequency which is modulated rapidly between a plurality of predetermined values.

While the system of the present invention has broad application, for example, in the field of radio telephony, the invention is disclosed as having particular application to communication equipment of the frequency shift keyed type. In equipment of this character the frequency of the keyed transmitter is shifted between two slightly separated frequencies, in conformance with telegraphic impulse signals. When received, the signals are applied to a frequency detector, wherein the separate frequencies cause different responses which are utilized to operate teletype or automatic tape recording machines.

In connection with systems of the above character there is a definite trend toward a maximum of automatic operations. It is desirable, for example, when the frequency of transmission of a frequency keyed transmitter is to be changed, that this be accomplished by a single operation, which effects retuning of all the tuned circuits in the transmitter. When the oscillator of a transmitter has been set for a desired operating frequency, or a sub-multiple thereof, it is usually required to tune correspondingly a number of buffers, multipliers, amplifiers, an antenna circuit, and the like, and especially in military application, it is extremely undesirable that a separate manual tuning operation be necessary in respect to each of these tuning operations. It is desirable rather that upon varying the frequency of the oscillator all the other tuned circuits of the system retune themselves automatically, and without attention on the part of the operator.

The present system is accordingly disclosed as one for conforming the tuning of a remote tuned or resonant circuit to the output frequency of an oscillator, it being understood that the remote tuned circuit may actually be the frequency determining element of a buffer amplifier, a frequency multiplier, a power amplifier, an antenna, or the like. The oscillator itself may be assumed to be highly stable in respect to frequency and is provided with means for shifting its mean frequency by slight amounts, while maintaining the high frequency accuracy of its original setting. In essence, in accordance with one modification of my system, the shifting output frequency of the oscillator is applied to the resonant circuit, which is to be tuned, and the amplitudes of the responses of the resonant circuit to the two shifted frequencies are compared. If the two responses are equal, the tuned circuit is precisely on frequency. Should they be unequal, however, the tuned circuit requires retuning. The direction of the retuning is determined by the algebraic sign of the difference between the magnitudes of the two responses.

During a normal frequency shift keying operation the total time of keying at one or another of the two keyed frequencies is indeterminate. It is therefore desirable that the frequency control function be accomplished independently of the keying, as by means of a separate control voltage, which may be of the square wave or sine type, and which alternately shifts the frequency of the transmitter from one to another value. The keying of the oscillator to alternate frequencies periodically may be accomplished during an initial tuning period and before the transmission of messages, or the frequency shifts which are required in order to accomplish tuning may be of small magnitude, so as not to affect the normal operation of the equipment. This expedient is particularly valuable when radio telephone signals are to be transmitted, since the keying signals which accomplish tuning may be left on continuously.

Various methods may be utilized for measuring the relative amplitudes of the voltages or the currents in the resonant circuit as a function of the applied frequencies. Basically, all these methods involve coupling of a detecting mechanism to the resonant circuit, and determination of the amplitudes of the detected voltages or currents as a function of the frequency of the signal impressed upon the tuned circuit. In accordance with one specific circuit for the purpose, which I have devised, a mechanical or electrical switch synchronized with the keying connects a detector first to one and then to another capacitor, so that the direct current potentials developed on the capacitors are proportional to the alternating voltages developed in the resonant circuit at the two frequencies. A voltage equal to the algebraic difference between the direct current voltages across the capacitors is applied to a polarized relay or equivalent device, the polarized relay serving to control a further device which operates a retuning mechanism for the tuned circuit. In the specific example of my invention which I have described and illustrated in compliance with the pertinent statutes relating to Letters Patent, the retuning mechanism comprises a mechanically driven condenser associated with a drive motor, the latter being required to rotate in one direction or another in accordance with the relative values of potential of the two capacitors, and being stationary when these potentials are equal.

As an alternative system sinusoidal frequency shift may be resorted to. In this case a sinusoidally amplitude modulated response is produced in the tuned circuit, which passes through a 180° phase as the driving frequency applied to the tuned circuit is shifted in frequency from one side of the response curve of the tuned circuit to the other. The phase of the response may then be compared with the phase of the frequency shift producing signal, to determine the relation of the resonant frequency of the tuned circuit to the average value of driving frequency, and the measurement of relative phase may be utilized to control a retuning operation.

It is a broad object of the invention, accordingly, to provide a system for automatic tuning of resonant circuits to the frequency of a source of signals.

It is a more specific object of the invention to provide a system for tuning buffer amplifiers, frequency multipliers, antennas, and the like to the frequency of a master or control oscillator, or to some multiple of that frequency.

It is still a further object of the invention to provide a novel tuning system for a frequency shift keyed transmitter.

It is a further object of the invention to provide a system for tuning a resonant circuit by applying thereto, in alternation, signals at frequencies below and above the frequency to which it is desired to tune the resonant circuit.

It is a more specific object of the invention to tune a resonant circuit to a mean frequency by applying thereto in alternation signals having frequencies above and below a mean frequency, detecting the responses of the circuit to the frequency excursions of the signals applied thereto, and utilizing the responses to retune a tuned circuit.

It is a still more specific object of the invention to tune a resonant circuit by applying thereto signals shifted in alternation to frequencies above and below a mean frequency, and utilizing the responses of the tuned circuit to the different frequencies for imposing charges upon each of a pair of condensers, the voltage across the condensers being combined algebraically to determine the sense or direction in which retuning of the tuned circuit must take place in order to retune the tuned circuit to the mean frequency applied thereto.

It is another object of the invention, in accordance with a modification thereof, to tune a resonant circuit by applying thereto a frequency modulated signal, and comparing the response of the tuned circuit in respect to the phase of modulations of the currents or voltages generated therein in response to the frequency modulated signal with the phase of the modulating frequency, and utilizing the comparison as a means of determining the sense in which the resonant circuit must be retuned in order to obtain correspondence with the mean value of the input frequency.

The above and still further objects, features and advantages of my invention will become evident upon consideration of the following detailed description of several embodiments thereof, especially when taken in conjunction with the accompanying drawings, wherein.

Figures 1, 2, 3, 4, 5:
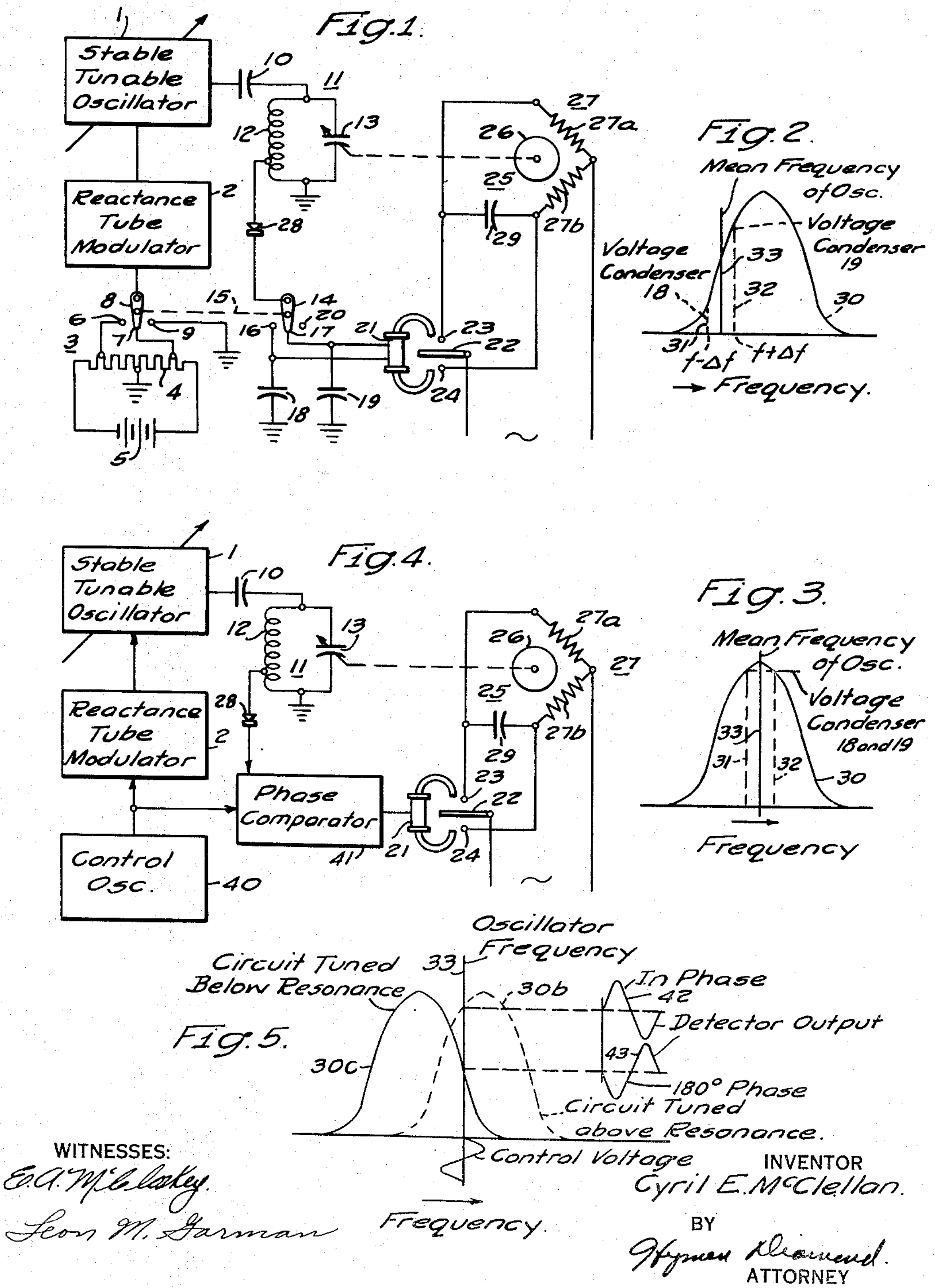
Figure 1 is a schematic circuit diagram of one embodiment of my invention.
Figure 2 is a circuit response characteristic showing the response of the tunable circuit of Figure 1 to frequency shifted signals applied thereto, when the circuit is not tuned to the mean frequency of the applied signals.
Figure 3 is a circuit response characteristic showing the response of the tunable circuit of Figure 1 to frequency shifted signals applied thereto when the circuit is tuned to the mean frequency of the applied signals.
Figure 4 is a schematic circuit diagram of a further embodiment of my invention.
Figure 5 is a series of circuit response curves showing the response of the tunable circuit of Figure 4 to a sine wave frequency modulated signal applied thereto, for various conditions of tuning of the tunable circuit.

Referring now specifically to Figure 1 of the drawings the reference numeral 1 identifies a tunable oscillator which is extremely stable in respect to frequency and the frequency of which may be varied above and below its mean value in equal amounts, by means of a reactance tube modulator 2. To the latter is applied frequency control potentials deriving from a potentiometer 3 comprising a resistance 4, the center point of which is grounded and across the end points of which is applied potential from potential source 5. Connected to points on the potentiometer 3 which are electrically equidistant on either side of the ground point are switch contacts 6 and 7. A switch arm 8 is provided which may be selectively connected with either the contact 6 or the contact 7 as desired, or alternatively, with a grounded contact 9. When the switch arm 8 is connected with the grounded contact 9 the oscillator 1 is tuned to its mean frequency. Upon connecting the switch arm 8 to the contact 7 the reactance tube modulator 2 is caused to introduce reactance into the oscillator 1 in such sense as to increase its frequency of oscillation, and when the switch arm 8 is connected to the contact 6 the reactance tube modulator is caused to introduce into the oscillator tube circuit a reactance such as to reduce the frequency of oscillation of the oscillator 1. Accordingly, if the switch arm 8 is moved alternately from the contact 6 to the contact 7 in equal time periods the frequency of the oscillator 1 will be reduced from its mean frequency by an amount $\Delta f$, and then increased by an amount $\Delta f$, in alternation, in synchronism with the movements of the switch arm 8.

The output of the oscillator 1 is applied over a coupling condenser 10 to a tuned circuit 11, comprising an inductance 12 and a tunable condenser 13, and develops in the tuned circuit 11 a circulating current, and across the inductance 12, a voltage, which have magnitudes and phases determined by the relation between the frequency of the oscillator 1 and the resonant frequency of the tuned circuit 11. A measure of the voltage developed across the inductance 12 is obtained by tapping from the coil 12 through a detector 28 to a switch arm 14 which is mechanically coupled with the switch arm 8 by means of a mechanical linkage 15, the position of the switch arm 14 corresponding at all times, accordingly, with the position of the switch arm 8. Associated with the switch arm 14 is a pair of contacts 16 and 17, the contact 16 being connected to one plate of a condenser 18, the other plate of which is grounded, and the contact 17 being connected with one plate of a condenser 19, the other plate of which is likewise grounded. The contacts 16 and 17 are so arranged with respect to switch arm 14 that upon connection of the switch arm 8 with contact 6, the switch arm 14 is connected with the contact 16 and likewise upon connection of the switch arm 8 with contact 7, the switch arm 14 is in contact with the contact point 17. An additional contact point 20 is provided which corresponds with the grounded contact 9, the contact 20 being left floating.

Connected across the contact 16 and 17 is a polarized relay 21. Since the condensers 18 and 19 are charged in the same sense, or with voltage of the same polarity, the voltage applied to the polarized relay 21 is equal to the arithmetical difference or to the algebraic sum of the voltages in the condensers 18 and 19, and will be in one sense if the condenser 19 has a greater charge than condenser 18, and in the opposite sense if the condenser 18 has a greater charge than the condenser 19.

Associated with the polarized relay 21 is an armature 22, normally in a neutral position, but which may be deflected in one sense or another in accordance with the direction of the energizing potential applied to the relay 21. Associated with the relay armature 22 is a pair of switch contacts 23 and 24, which may be selectively contacted by the armature 22, in well known fashion, in response to energization of the relay 21.

The polarized relay 21 and its associated armature 22 and contacts 23 and 24, are utilized to control the sense of rotation of a capacity type alternating current reversible motor 25 having a rotor 26 and field winding 27. Alternating current voltage from a line source is applied between a center tap on the field winding 27 and the armature 22 of the relay 21, the end points of the field winding 27 being connected between the contact 23 and 24, and a phasing condenser 29 being connected across the contacts 23 and 24.

The two halves 27*a* and 27*b* of the field winding 27 are physically oriented at an angle of 90° with respect to one another. Upon contact of the armature 22 with the contact 23, the section 27*a* of field winding 27 is connected directly across the alternating current line, while the section 27*b* is connected across the alternating current line in series with the phasing condenser 29, which shifts the phase of the current in section 27*b* by 90° with respect to the current in section 27*a*. The magnetic field provided by the two sections 27*a* and 27*b* of the field winding 27, physically oriented mutually in 90° relation, and sustaining current flows in 90° relative phase, is a rotating magnetic field causing rotation of the rotor 26 in a first direction.

When armature 22 makes contact with contact 24, the section 27*b* is directly connected across the alternating current line, the section 27*a* being connected in series with the phasing condenser 29, and the direction of rotation of the magnetic field provided by the field winding 27 accordingly reverses, reversing correspondingly the direction of rotation of the rotor 26.

The direction of rotation of the rotor 26, accordingly, depends upon the position of the armature 22, being in one direction when the armature 22 is in contact with contact 23 and in the opposite direction when the armature 22 is in contact with the contact 24.

While I have shown and described one specific circuit retuning mechanism, in the form of a particular type of motor control circuit, it will be clear to those familiar with the pertinent art that many other motor control circuits are available for the purpose, including those energized from direct current lines, and that the specific form of motor control circuit illustrated and described represents merely one specific example of an available such circuit, provided by way of illustrative example only, and forms no part of my invention, per se.

Describing now the operation of the system of Figure 1, and having reference to the circuit characteristics shown in Figures 2 and 3, assume that the frequency of the oscillator 1 is lower than the frequency of the tuned circuit 11. Assume further that the frequency characteristic of the tuned circuit 11 may be represented generally by the curve 30, in Figures 2 and 3 of the drawings. It will be evident that the mean frequency of the oscillator 1 falls, for the condition stated, on the ascending slope of the resonance characteristic 30 of the tuned circuit 11, and that as the frequency of the oscillator 1 is shifted by small amounts $\Delta f$, first negatively and then positively, the operating point falls alternately lower and higher, on the characteristic curve 30. The detected outputs provided by the detector 28 accordingly, are proportional to the ordinates 31 and 32 of the characteristic 30 which correspond with the instantaneous operating frequencies shown in Figure 2 of the drawings as $f-\Delta f$ and $f+\Delta f$.

When the switch arm 8 is thrown to the right as shown in Figure 1, and the oscillator 1, accordingly, transmits a frequency equal to $f+\Delta f$, $f$ being the mean frequency of the oscillator, the switch arm 14 is in contact with contact 17, and the condenser 19 is supplied with charge over the detector 28, the total charging voltage being proportional to the amplitude of the ordinate 32. When, on the other hand, the switch arm 8 is shifted to the left, the oscillator 1 transmits a frequency equal to its mean frequency minus $\Delta f$, the switch arm 14 makes contact with the contact 16 and the condenser 18 is charged to a potential proportional to the amplitude of the ordinate 31. It will be seen, accordingly, that if the rectifier 28 is poled so that the charges of the condensers 18 and 19 with respect to ground are positive, that in the example given the condenser 19 will be charged to a higher potential than the condenser 18 and the net voltage supplied to the polarized relay 21 will be so poled as to drive the armature 22 into contact with the contact 24, which may be assumed to energize the motor 25 for rotation in such direction as to increase the capacity of the condenser 13 and thereby bring the frequency of the tuned circuit 11 down into coincidence with the frequency of the oscillator 1, as represented by the ordinate 33.

Were the frequency of the oscillator 1 higher than the frequency to which circuit 11 is resonant, operation taking place then on the descending slope of the resonance curve 30, the condenser 18 would be charged to a higher potential than the condenser 19, the armature of the relay 22 would be actuated into contact with contact 23, and the field windings 27*a* and 27*b* of the motor 25 being supplied with currents of reversed relative phase to those subsisting in the alternative operation, the rotor 26 would revolve in the opposite direction and the condenser 13 would be tuned in the opposite sense, to bring the frequency of the tuned circuit 11 up until the frequency of the tuned circuit 11 was in precise coincidence with the frequency provided by the oscillator 1.

When the ordinates 31 and 32 corresponding with the shifted frequencies of the oscillator 1 are located by equal increments on either side of the axis of the resonance characteristic 33, coinciding with the mean frequency of the oscillator 1, the ordinates 31 and 32 become of equal magnitudes and accordingly the charges on the condensers 18 and 19 are likewise equal, and no potential is applied to the polarized relay 21. The armature 22 of the relay 21 accordingly assumes a central position and the motor 26 becomes de-energized, indicating frequency corresponding between the tuning of the resonant circuit and the driving frequency.

Reference now is made to Figure 4 of the drawings, wherein is illustrated a schematic circuit diagram of a modification of the system of Figure 1, corresponding elements of Figures 1 and 4 being identified by identical reference characters. The stable oscillator 1 supplies signals to the tuned circuit 11 comprising the coil 12 and the tuning condenser 13, as in the system of Figure 1. The frequency of the oscillator 1 is determined by a reactance tube modulator 2, to which is applied a sine wave modulated signal of extremely low amplitude, provided by a sine wave oscillator 40. Accordingly the frequency of the oscillator 1 is subjected to continuous slight variations in frequencies above and below its mean frequency *f*. The current circulating in the tuned circuit 11, and the voltage across any portion of the circuit is, accordingly, in general amplitude modulated by the frequency excursions of the oscillator 1.

A detector 28 is connected across a portion of the coil 12, and the detected output is applied to a phase comparison circuit 41, to which is also applied the output of the sine wave oscillator 40. As will be shown hereinafter, the phase of the detected voltage provided by the detector 28 is a function of the relation between the resonant frequency of the tuned circuit 11 and the frequency of the driving source of oscillator 1. The output of the phase comparison circuit is, as is well known in the art, a direct current having a polarity which depends upon the relative phases of the alternating current supplied thereto. Circuits of this character being well known, per se, and forming no part, per se, of my invention, the specific circuit utilized is not described in detail, either in respect to its arrangement or its mode of operation.

The output of the phase comparator 41 is applied to the polarized relay 21 which controls the direction of rotation of the motor 25, which is identical, in respect to its structure, arrangement, and operation, with the similar motor 25 illustrated in Figure 1 and described in detail in connection with the description of the system illustrated therein.

The motor 25 is coupled mechanically with the tuning condenser 13 and serves to retune the circuit 11 to the frequency of the oscillator 1, in response to any discrepancy between the resonant frequency of the circuit and the frequency of the oscillator.

Proceeding now with the explanation of the operation of the system of Figure 4, and having reference to the frequency characteristics illustrated in Figure 5, when the frequency of the oscillator 1 is tuned precisely to the frequency of the tuned circuit 11 the small modulating frequency variations of the oscillator 1 which occur in response to the potentials applied to the reactance modulator tube by the sine wave source 40 result in substantially no variations in amplitude in the circulating currents existing in the tuned circuit 11, provided the amplitude of the modulating signal is sufficiently small.

Such variations as do occur are direct current pulsations rather than true alternating currents. Accordingly no phase significant signal is applied to the phase comparison circuit 41 by the detector 28 and the output of the phase comparison circuit 41 is zero. Under these conditions the armature 22 of the polarized relay 21 remains stationary.

Should the tuned circuit 11 be tuned above the resonant frequency of the oscillator 1, as represented by the ordinate 33, variations of the oscillator frequency will result in amplitude modulations of the circulating current in the tuned circuit 11 about the point of interception of ordinate 33 with the circuit characteristic 30*b* and the output signal will be substantially a sine wave, as illustrated at 42 in Figure 5. This response will be in phase with the modulating frequencies for the conditions stated and the phase comparison circuit 41, being properly poled, will provide accordingly an output voltage of such polarity that, when applied to energize the polarized relay 21, the motor 25 will be caused to rotate in such sense as to increase the capacity of the condenser 13, and correspondingly reduce the tuning of the tuned circuit 11. On the other hand should the resonant frequency of the circuit 11 be below the mean frequency of the oscillator 1 the variations in amplitude 43 of the circulating current in the tuned circuit 11 will take place about the intersection of the resonance characteristic 30*c* with the ordinate 33, and in such case the amplitude variations illustrated at 43 will be 180° out of phase with the modulating signals provided by the sine wave oscillator 40. In such case, the phase comparison circuit 41 will provide an output voltage of polarity opposite to that providing when the tuned circuit 11 was tuned above the frequency of the oscillator 1, causing a movement of the armature 22 in opposite direction, and consequently a rotation of the rotor 26 in such sense as to decrease the capacity of the condenser 13, and to increase the tuned frequency of the resonant circuit 11.

Operating voltage will be applied to the polarized relay 21 whenever the tuned circuit 11 is detuned with respect to the signal applied thereto, and the direction of this potential will always be such as to cause the motor 26 to retune the tuned circuit 11. The retuning operation will continue until there is coincidence between the output frequency of the oscillator 1 and the tuning of the resonant circuit 11, at which time output voltage over the detector 28 will fail and the phase comparator 41 will provide no output. The relay 21 then assuming a central position, the rotor 26 ceases to move.

Considering the invention as applied to a frequency shift keyed transmitter, upon varying the mean frequency of the master or control oscillator of the transmitter, all subsequent tuned circuit elements associated therewith in the transmitter will follow the frequency of the master or control oscillator, being displaced therefrom by a small frequency while the frequency of the oscillator is changing and overtaking the latter upon cessation of variation of the frequency thereof.

All the tuned circuits comprising the transmitter, as for example, the antenna, buffer stages and the like, will, accordingly, remain in frequency correspondence with the transmitter oscillator, and the operator may set the oscillator frequency to any desired frequency with the assurance that the entire transmitter will thereby be retuned in correspondence, and that the transmitter will automatically be ready for operation at its new frequency.

While I have described and illustrated two specific embodiments of my invention it will be realized that variations of the general arrangement and of various details thereof may be resorted to without departing from the true spirit and scope of the invention as defined in the appended claims.

I claim as my invention:

1. In combination in an automatic tuning system, a source of alternating current of a predetermined mean frequency, means for shifting the frequency of said source of alternating current alternately above and below said mean frequency by discrete frequency increments and for equal time intervals, a load tunable to resonance coupled to said source, said load being detuned with respect to the frequency of said source, and operating on a slope of its frequency characteristics, whereby there is established a variation of response of said load to the shifting of the frequency of said source, and means responsive to said variation of response for varying the tuning of said load.

2. In an automatic tuning system a source of alternating current of variable frequency operating at a predetermined mean frequency, means for varying the frequency of said source in discrete steps to a pair of frequencies alternately above and below said mean frequency, a load tunable to resonance detuned with respect to said mean frequency and a coupled in driven relation to said source, first means for establishing a first parameter the magnitude of which is dependent upon the response of said load to one of said pair of frequencies, second means for establishing a second parameter the magnitude of which is dependent upon the response of said load to the other of said pair of frequencies and means responsive simultaneously to said first and second parameters for tuning said load to said mean frequency.

3. In an automatic tuning system, a source of alternating current of variable frequency operating at a predetermined mean frequency, means for varying the frequency of said source alternately and in discrete steps above and below said mean frequency, a circuit tunable to resonance detuned with respect to said mean frequency and coupled in driven relation to said source, first means for establishing a first parameter the magnitude of which is dependent upon the response of said circuit to one of said pair of frequencies, second means for establishing a second parameter the magnitude of which is dependent upon the response of said circuit to the other of said pair of frequencies, means for coupling said first and second means with said circuit in alternation and in synchronism with the operation of said means for varying the frequency of said source, means for comparing said parameters established by said first and second means, and means responsive to said last named means for tuning said circuit to said mean frequency.

4. In an automatic tuning system, a source of variable frequency having a predetermined mean frequency, a circuit tunable to resonance coupled to said source in responsive relation thereto, said circuit being detuned with respect to the frequency of said source, means for periodically varying the frequency of said source of variable frequency, comprising a source of alternating current signal, variation of said frequency of said source of variable frequency effecting a periodic variation of response of said circuit, means for comparing the phase of said periodic variation of response with the phase of said alternating current signal and for establishing a control signal in accordance with said comparison, and means responsive to said control signal for modifying the tuning of said circuit.

5. A tuning system comprising a source of alternating current, having a predetermined mean frequency, a tunable resonant circuit coupled with said source of alternating current in responsive relation thereto, said tunable resonant circuit having a frequency characteristic having a positive slope, a negative slope and a region of substantially zero slope interconnecting said positive slope with said negative slope, means for periodically varying the frequency of said source alternately above and below said mean frequency to establish variations of response in said resonant circuit, a motor, means responsive to tuning of said resonant frequency with respect to said mean frequency along alternative slopes for effecting rotation of said motor in alternative senses, said last named means being responsive to tuning of said resonant circuit with respect to said mean frequency along said region of substantially zero slope for effecting cessation of rotation of said motor.

6. An automatic tuning system comprising a source of alternating current having a predetermined mean frequency, a tunable resonant circuit coupled with said source of alternating current in responsive relation thereto, said tunable resonant circuit having a frequency characteristic having a positive slope and a negative slope and a region of substantially zero slope interconnecting said positive slope with said negative slope, means for periodically varying the frequency of said source alternately above and below its mean frequency to generate variations of response of said tunable resonant circuit, and means responsive to the character of said variations of response for effecting a variation of the tuning of said resonant circuit, said variations of response and said variation of tuning being substantially non-existent upon adjustment of said tunable circuit for operation substantially centrally of said region of substantially zero slope.

7. An automatic tuning system comprising a source of alternating current having a predetermined mean frequency, a tunable resonant circuit coupled with said source of alternating current in responsive relation thereto, said tunable resonant circuit having a frequency characteristic having a positive slope and a negative slope and a region of substantially zero slope interconnecting said positive slope with said negative slope, means for periodically effecting variations of the frequency of said source alternately above and below its mean frequency to generate variations of response of said resonant circuit, means for determining the relative directions of variation of said variations of response with respect to said variations of the frequency of said source, and means responsive to said last named means for varying the tuning of said resonant circuit in accordance with the said relative directions of variation.

8. The combination in accordance with claim 7 wherein said means for determining the relative directions of variation of said variations of response comprises a phase comparator for determining the relative phases of said variations of response and of said variations of the frequency of said source.

9. The combination in accordance with claim 7 wherein said means for determining the relative directions of variation of response with respect to said variations of the frequency of said source comprises a pair of condensers, means for grounding one side of each of said condensers, means for applying to the remaining side of one of said condensers a potential proportional to the response of said resonant circuit during variation of the frequency of said source above its mean frequency, means for applying to the remaining side of the other of said condensers a potential proportional to the response of said resonant circuit during variation of the frequency of said source below its mean frequency, and means responsive to the difference of potential across said condensers in series for determining the direction of variation of the tuning of said resonant circuit.

CYRIL E. McCLELLAN.

References Cited in the file of this patent

UNITED STATES PATENTS

| Number | Name | Date |
|---|---|---|
| 1,780,669 | Bruckel et al. | Nov. 4, 1930 |
| 2,287,925 | White | June 30, 1942 |
| 2,415,799 | Reifel et al. | Feb. 11, 1947 |
| 2,449,923 | Anderson | Sept. 21, 1948 |
| 2,456,763 | Ziegler | Dec. 21, 1948 |
| 2,466,931 | Crandell | Apr. 12, 1949 |
| 2,483,409 | Gold | Oct. 4, 1949 |
| 2,501,368 | White | Mar. 21, 1950 |